United States Patent [19]
Woodard

[11] Patent Number: 5,587,910
[45] Date of Patent: Dec. 24, 1996

[54] VEHICLE NAVIGATION SYSTEM WITH NON-OVERFLOW DIGITAL FILTER

[75] Inventor: Jeffrey P. Woodard, Irvine, Calif.

[73] Assignee: Rockwell International Corporation, Seal Beach, Calif.

[21] Appl. No.: 384,084

[22] Filed: Feb. 6, 1995

[51] Int. Cl.⁶ ................................................ G06F 17/00
[52] U.S. Cl. ............................... 364/443; 364/724.15
[58] Field of Search ................................. 364/443, 572, 364/724.01, 724.15

[56] References Cited

U.S. PATENT DOCUMENTS

| | | | |
|---|---|---|---|
| 3,662,115 | 5/1972 | Saito et al. | 179/15 A |
| 4,554,858 | 11/1985 | Wachi et al. | 84/1.19 |
| 4,796,216 | 1/1989 | Renner et al. | 364/724.15 |
| 4,884,230 | 11/1989 | Gielis et al. | 364/724.15 |
| 5,235,529 | 8/1993 | Hanson et al. | 364/572 |
| 5,436,858 | 7/1995 | Staver | 364/724.1 |

OTHER PUBLICATIONS

Marshall et al., *Computer–Aided Design Of The Gray–Markel Filter* Sep. 1981, Electronics Letters, vol. 17, No. 18, pp. 662–664.

Gray et al., *Digital Lattice And Latter Filter Synthesis*, Dec. 1973, IEEE Trans. On Audio And Electronics, vol. AU–21, No. 6, pp. 491–500.

*Primary Examiner*—Michael Zanelli
*Attorney, Agent, or Firm*—George A. Montanye; Charles T. Silberberg; Tom Streeter

[57] ABSTRACT

A vehicle navigation system uses a one-multiplier Gray-Markel filter. The sign parameter of each stage of the filter is selected by an algorithm which limits the maximum signal passing through the filter, thereby preventing overflow.

2 Claims, 9 Drawing Sheets

FIG. 3 PRIOR ART

VEHICLE NAVIGATION SYSTEM WITH NON-OVERFLOW DIGITAL FILTER

BACKGROUND OF THE INVENTION

This invention relates to digital signal processing, and has particular relation to one-multiplier Gray-Markel filters used in vehicle navigation systems.

A one-multiplier Gray-Markel filter has one or more stages, each of which includes a multiplier, a delay element, and three summers. The first summer is driven by the filter input and the delay element, the second summer is driven by the filter input and the multiplier, and the third summer is driven by the multiplier and the delay element. The third summer always acts as an adder, but the first summer acts as a subtracter (filter input minus delay element output) when the second summer acts as an adder, and acts as an adder when the second summer acts as a subtracter (filter input minus multiplier output). Each stage therefore has a sign parameter. The sign parameter of a stage is +1 when the second summer acts as an adder, and is −1 when the second summer acts as a subtracter.

The conventional art is embodied in the seminal article, A. H. Gray, Jr. and J. D. Markel, "Digital Lattice and Ladder Filter Synthesis", IEEE Trans. AU, AU-21, pp. 491–500, December, 1973. In that art, the average energy of the signal passing through the filter must be kept below some preselected maximum. That article set out an algorithm for selecting the sign parameter of each stage so that this average energy criterion is met. This criterion is appropriate in, for example, voice synthesis and compression. Overall voice quality is improved when this criterion is selected, even though the filter overflows from time to time. Each overflow is so brief that it is hardly noticeable, and is rapidly damped out by subsequent input signals.

This is not the case in vehicle navigation. Errors do not damp out; they accumulate. This is especially true when the navigation signal is part of a servo loop, used to control the vehicle, and not just locate it. In this case, the maximum signal passing through the filter must be kept below the preselected maximum.

SUMMARY OF THE INVENTION

The present invention describes and claims a navigation system in which a Gray-Markel filter is used, and in which the sign parameter of each stage of the filter is selected by an algorithm which limits the maximum signal passing through the filter (thereby preventing overflow), even at the cost of increasing the average energy of the signal.

BRIEF DESCRIPTION OF THE DRAWINGS

FIG. 3 shows how FIGS. 3a–3c together form a flow chart showing the average energy limitation algorithm included in the prior art.

DETAILED DESCRIPTION OF THE DRAWINGS

Figure 1:
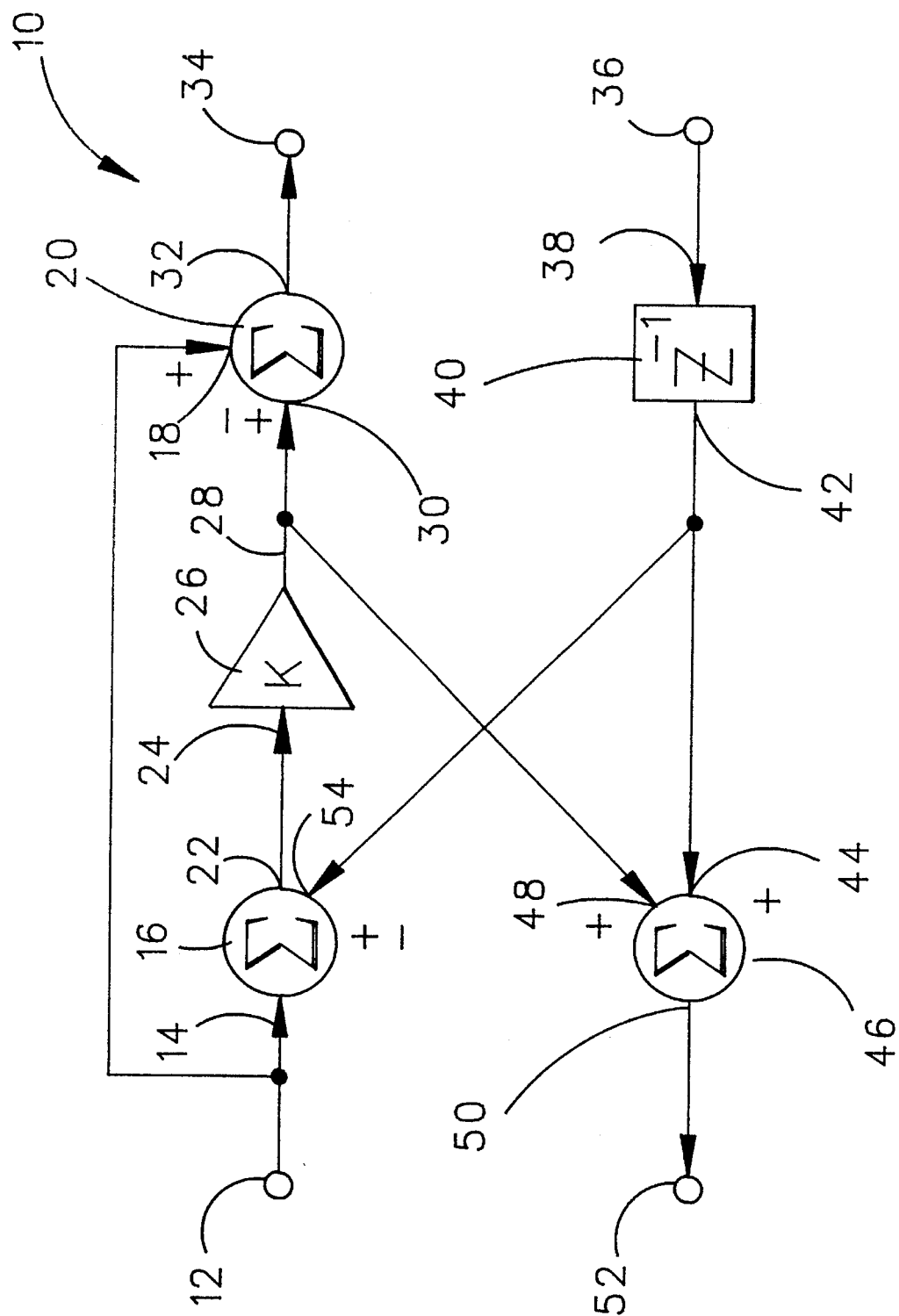
FIG. 1 is a stage of a one-multiplier Gray-Markel filter.

FIG. 1 shows a stage 10 of a one-multiplier Gray-Markel Filter. Each stage 10 has a first input 12 which drives a plus input 14 of a first summer 16 and a plus input 18 of a second summer 20. An output 22 of the first summer 16 drives an input 24 of a multiplier 26, which multiplies the number applied to the input 24 by a constant k. k lies between −1 and +1, inclusive. The output 28 of the multiplier 26 drives a variable input 30 of the second summer 20. An output 32 of the second summer 20 drives a first output 34 of the stage 10.

A second input 36 drives an input 38 of a delay element 40, an output 42 of which drives a first plus input 44 of a third summer 46. The output 28 of the multiplier 26 drives a second plus input 48 of the third summer 46. An output 50 of the third summer 46 drives a second output 52 of the stage 10. The output 42 of the delay element 42 also drives a complement input 54 of the first summer 16. It is called a complement input because it is a plus input when the variable input 30 of the second summer 20 is a minus input, and it is a minus input when the variable input 30 of the second summer 20 is a plus input.

Figure 2:
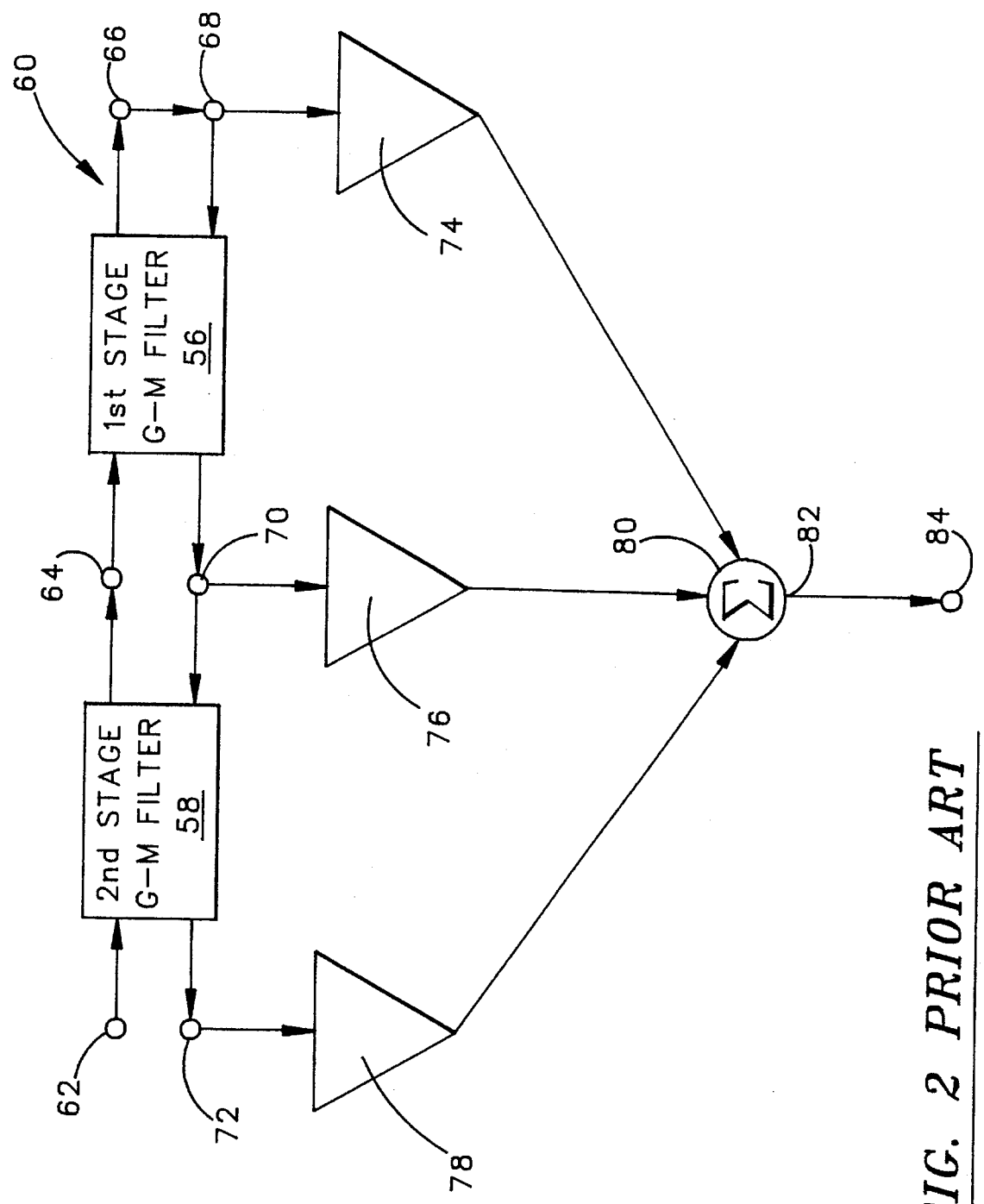
FIG. 2 is a Gray-Markel filter comprising several of the stages shown in FIG. 1.

In FIG. 2, a zeroth stage 56 is cascaded with a first stage 58 to form a two-stage one-multiplier Gray-Markel filter 60. In this case:

- the first input 62 of the first stage 58 is the input of the filter 60;
- the first output 64 of the first stage 58 is the first input of the zeroth stage 56;
- the first output 66 of the zeroth stage 56 is connected to the second input of the zeroth stage 56;
- the second output 70 of the zeroth stage 56 is the second input of the first stage 58; and
- the first stage 58 has a second output 72.

Additional stages may be cascaded as desired. Regardless of the number of stages, the first output and second input of the zeroth stage 56 are tied together. The first input 62 of the highest stage (the first stage 56 in a two stage filter) is, as noted above, the input of the filter 60. The second inputs 68, 70 of each stage 56, 58, and the second output 72 of the highest stage 58 are tapped by multipliers 74, 76, 78, the outputs of which are summed in a summer 80. The output 82 of the summer 80 is the output 84 of the filter 60. Any or all of the multipliers 74, 76, 78 may be omitted if desired, as may some of the taps 68, 70, 72 driving them.

The conventional (average energy limitation) method for determining the sign parameter follows:

Let k(m) be the multiplication factor in the multiplier 26 of the mth stage of a one-multiplier Gray-Markel filter which has M stages, 0 through M−1, inclusive. We seek S(m), the sign parameter of the mth stage. Define:

$$q(m) = ((1 + |k(m)|)/(1 - |k(m)|))^{1/2}. \quad (1)$$

and let the m*th stage have the k(m) of the largest magnitude, that is, $$m^* = \arg[\max\{|k(m)|\}], 0 \leq m \leq M-1, \quad (2)$$

Now let:

$$Q(m^*) = 1, \quad (3)$$

and let:

$$S(m^*)=sgn(k(m^*)) \quad (4)$$

We recursively define S(m+1) and Q(m+1) for m=m*, and increasing all the way to m=M−2, as follows:

$$S(m+1) = -sgn(k(m+1)) \quad \text{if } Q(m) < 1/q(m), \quad (5a)$$

$$S(m+1) = sgn(k(m+1)) \quad \text{if } Q(m) \geq 1/q(m). \quad (5b)$$

$$Q(m+1) = Q(m+1)/q(m) \quad \text{if } S(m) = sgn(k(m)), \text{ and} \quad (5c)$$

$$Q(m+1) = Q(m)q(m) \quad \text{if } S(m) = -sgn(k(m))). \quad (5d)$$

Q(M−1) need not be computed once S(M−1) has been computed, but it does no harm to compute it if the user finds it convenient to do so, as, for example, for ease of programming.

We likewise recursively define S(m−1) and Q(m−1) for m=m*, and decreasing all the way to m=1, as follows:

$$S(m-1) = sgn(k(m-1)) \quad \text{if } Q(m) < 1/q(m-1), \quad (6a)$$

$$S(m-1) = -sgn(k(m-1)) \quad \text{if } Q(m) \geq 1/q(m-1). \quad (6b)$$

$$Q(m-1) = Q(m)q(m-1) \quad \text{if } S(m-1) = sgn(k(m-1)), \text{ and} \quad (6c)$$

$$Q(m-1) = Q(m)/q(m-1) \quad \text{if } S(m-1) = -sgn(k(m-1))). \quad (6d)$$

As before, Q(0) need not be computed once S(0) has been computed, but may be computed if convenient.

Figure 3:
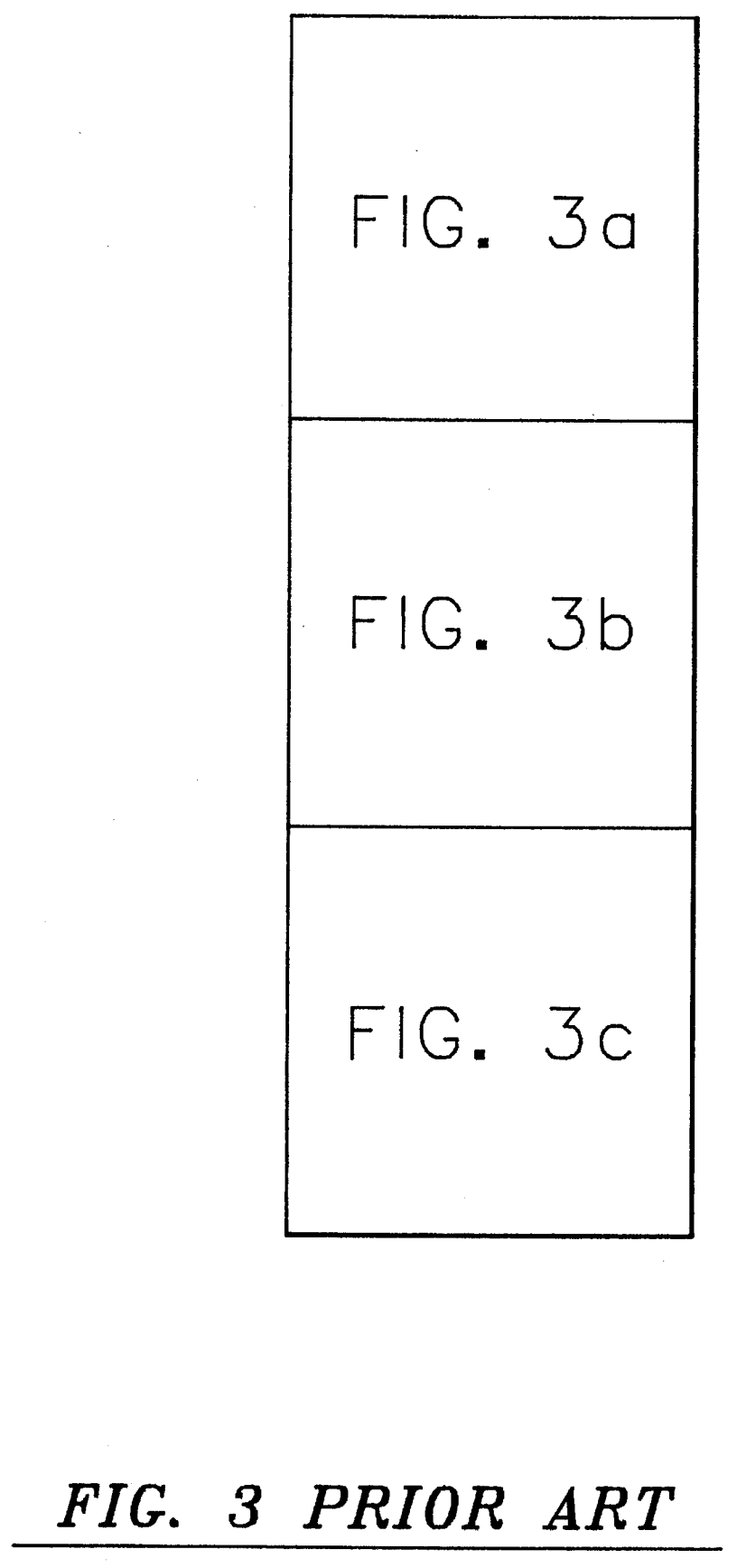
Figure 3A:
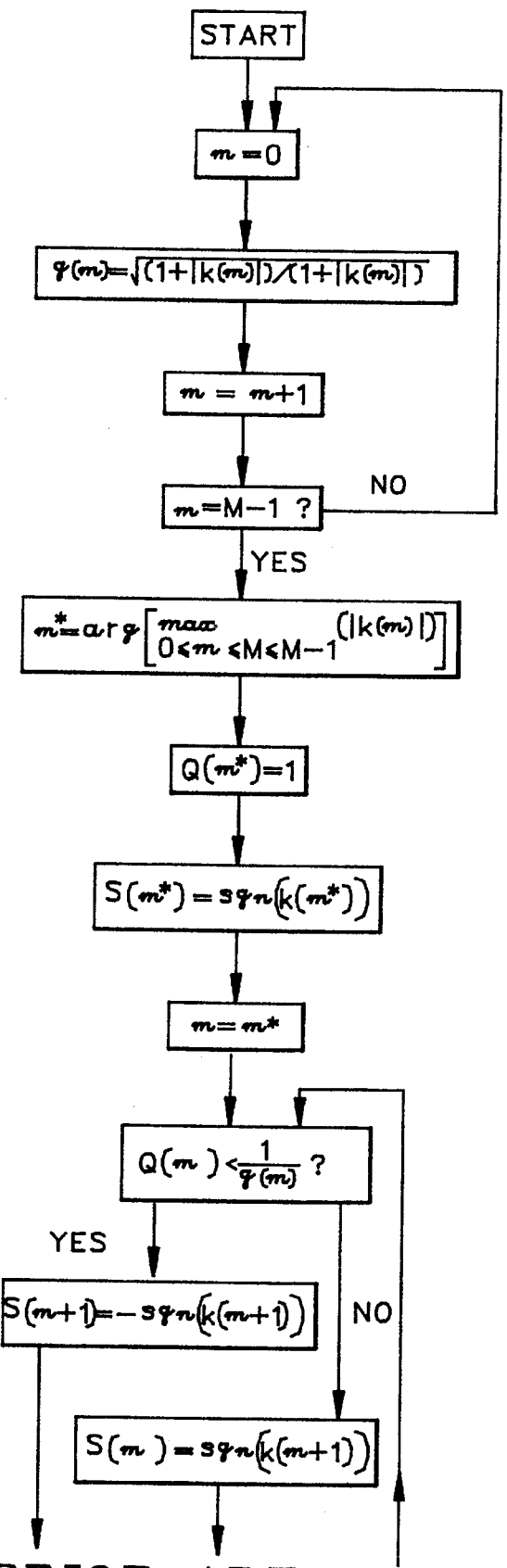
FIGS. 3a–3c are arranged.
Figure 3B:
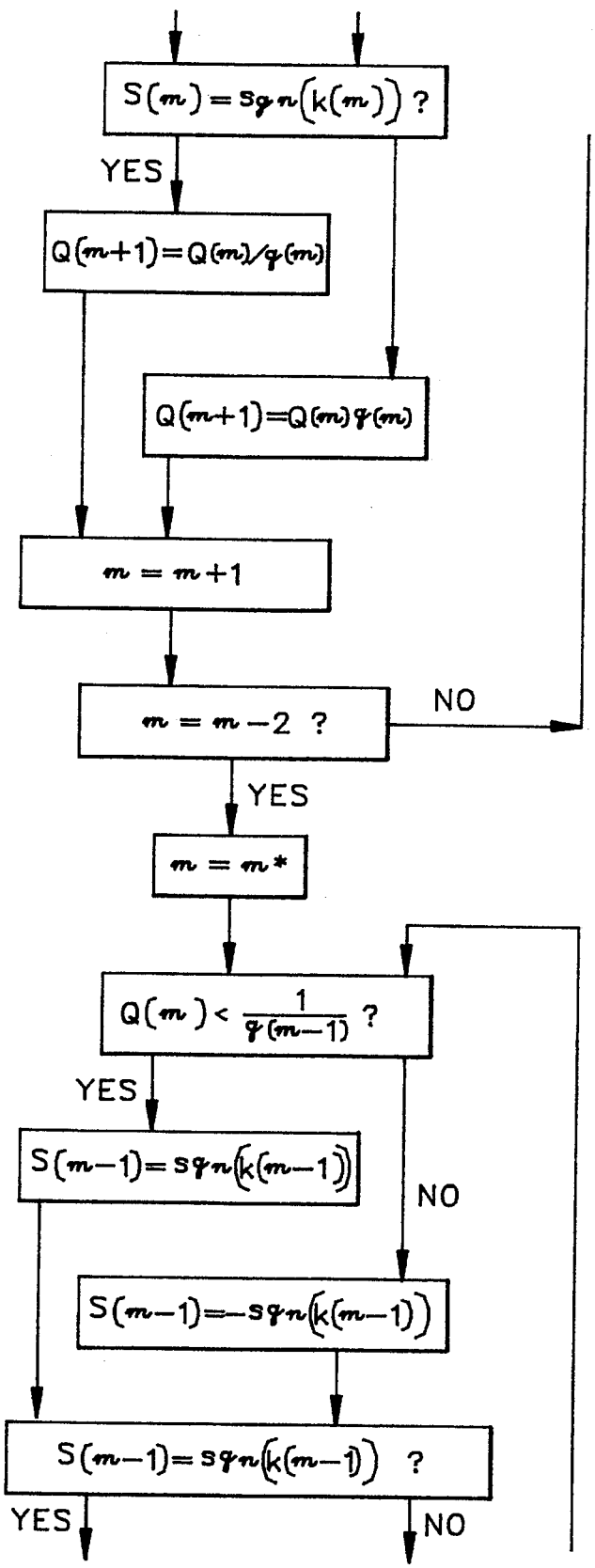
Figure 3C:
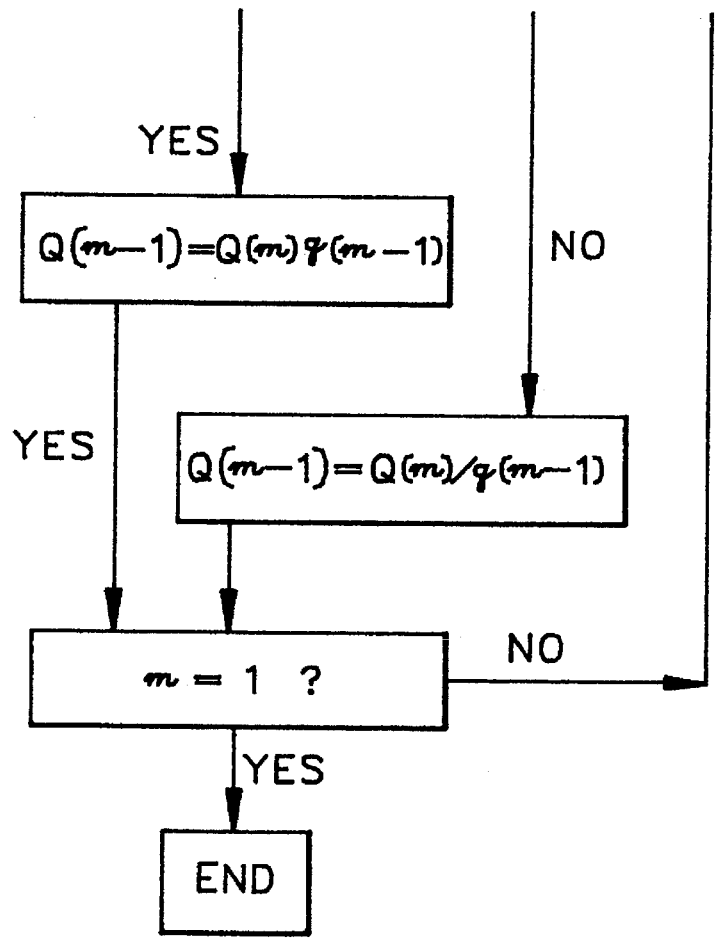

FIG. 3 shows how FIGS. 3a–3c are arranged. FIGS. 3a–3c together form a flow chart showing this prior art algorithm. An important feature of this algorithm is that S(m)=sgn(k(m)) sometimes and S(m)=−sgn(k(m)) sometimes.

Figure 4:
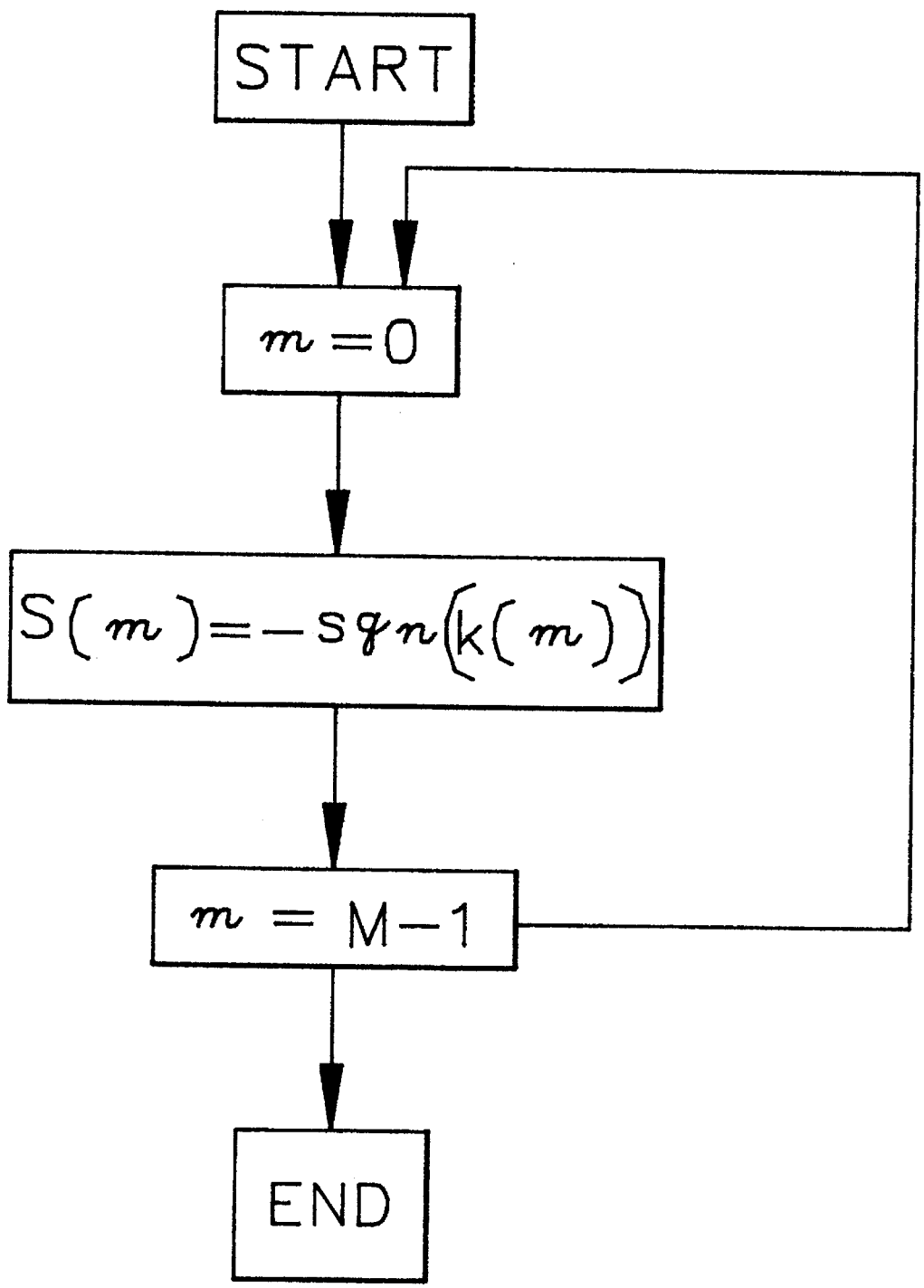
FIG. 4 is a flow chart showing the maximum signal limitation algorithm included in the present invention.

FIG. 4 is a flow chart showing the algorithm included in the present invention: S(m)=−sgn(k(m)), always. Applicant has performed computer simulations of many multi-stage one-multiplier Gray-Markel filters, and has never found a sign parameter assignment for all stages which matches the sign parameter assignment made under the average energy limitation algorithm of the prior art.

Figure 5:
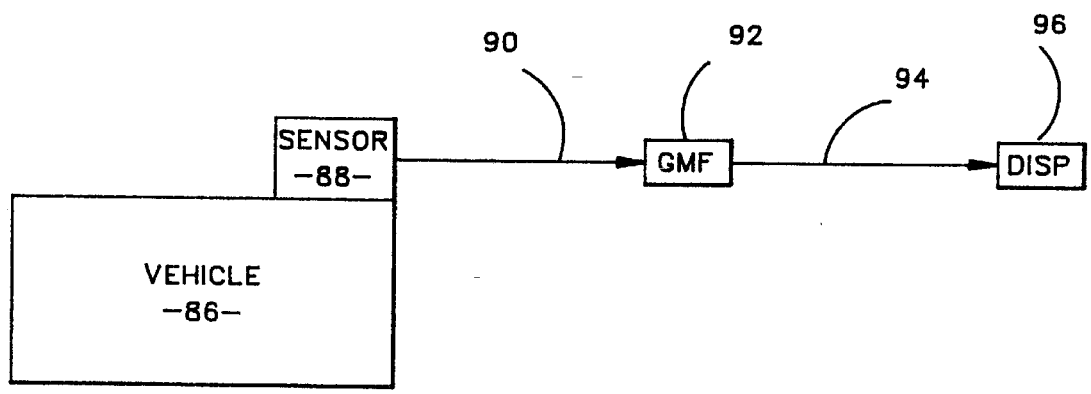
FIG. 5 shows the complete invention.

FIG. 5 shows the complete invention. A vehicle 86 has a navigation sensor 88 mounted on it. The sensor 88 produces a navigation signal 90 indicative of its position, orientation, linear velocity, rotational velocity, linear acceleration, rotational acceleration, or any combination of the foregoing. The sensor 88 may include a prefilter for digitizing, demodulating, or other prefiltering of the navigational signal. The navigation signal 90 is then applied to a one-multiplier Gray-Markel filter 92 with stages having sign parameters produced by the S(m)=−sgn(k(m)) rule. The Gray-Markel filtered signal 94 is then applied to a display 96. The display 96 may include a postfilter, and may display the signal 94 to a human operator, to other apparatus (whether in a servo loop or not), or both.

Figure 6:
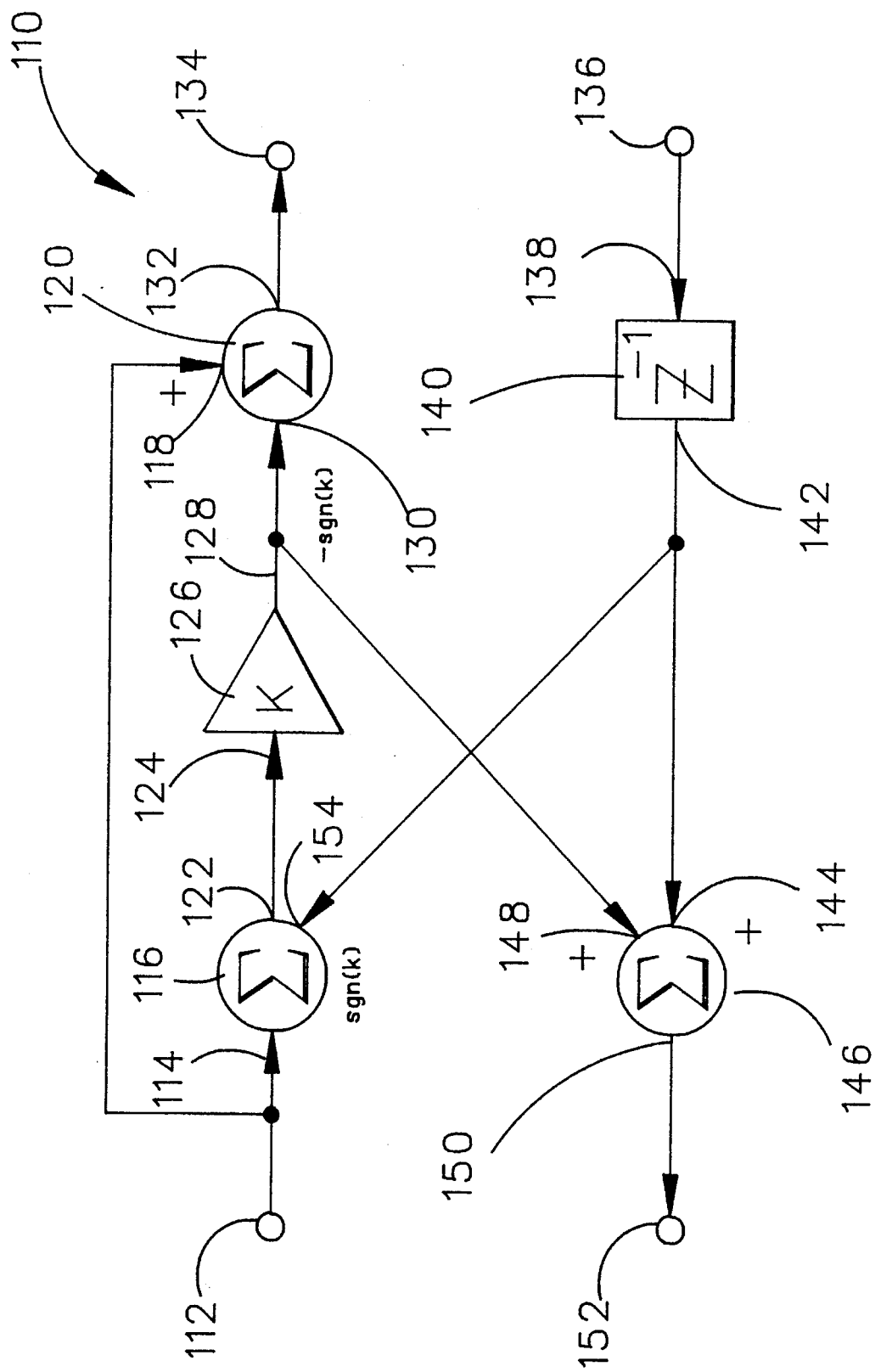
FIG. 6 shows the details of one stage of the improved Gray-Markel filter included in FIG. 5.

FIG. 6 shows the details of one stage 110 of the improved Gray-Markel filter 92 included in FIG. 5. The numbering of the elements of FIG. 6 follows that of FIG. 1, incremented by 100.

Two significant differences distinguish the apparatus shown in FIG. 6 from that shown in FIG. 1.

The first difference lies in the sign of present invention's input 154 to summer 116. In FIG. 1, the prior art sign of input 54 to summer 16 was always the inverse of the sign of the input 30 to summer 20. In the present invention shown in FIG. 6, the sign of input 154 to summer 116 is always the sign of k.

The second difference lies in the sign of present invention's input 130 to summer 120. In FIG. 1, the prior art input 30 to summer 20 could have a sign which was either positive or negative, as the needs of the application might require. In FIG. 6, the present invention removes this freedom: the sign of input 130 to summer 120 is always the negative of the sign of k.

All other inputs (114 to summer 116, 118 to summer 120, and both 144 and 148 to summer 146) are positive in the present invention, just as their analogous inputs (14 to summer 16, 18 to summer 20, and both 44 and 48 to summer 46) are positive in the prior art.

SCOPE OF THE INVENTION

Particular embodiments of the present invention have been disclosed in some detail, but the true spirit and scope of the present invention are not limited thereto. Such spirit and scope are limited only by the appended claims, and their equivalents.

What is claimed is:

1. A vehicle navigational system, comprising:
   (a) a vehicle;
   (b) a sensor mounted on the vehicle and producing a navigation signal;
   (c) a one-multiplier Gray-Markel filter having an input connected to receive the navigational signal, and having at least one stage, each stage comprising:
      (1) a first summer connected to receive, at a plus input, a first input to the stage;
      (2) a multiplier connected to multiply an output of the first summer by a constant k;
      (3) a second summer connected to receive:
         (A) at a plus input, the first input to the stage; and
         (B) at a variable input, an output of the multiplier, the variable input being:
            (1) a minus input if k is greater than 0; and
            (2) a plus input if k is less than 0;
   wherein an output of the second summer is a first output of the stage;
      (4) a delay element connected to:
         (A) receive a second input to the stage; and
         (B) apply an output to a complement input of the first summer, the complement input being the negative of the variable input; and
      (5) a third summer connected to receive:
         (A) at a first plus input, the output of the multiplier; and
         (B) at a second plus input, the output of the delay element; and
   (d) a filtered navigation signal display driven by an output of the one-multiplier Gray-Markel filter.

2. A vehicle navigational method, comprising the steps of:
   (a) mounting a sensor on the vehicle;
   (b) producing a navigation signal from the sensor;
   (c) filtering the navigation signal in at least one series of steps each such step series comprising the steps of:
      (1) creating a first sum by adding together a first input to the step series and a second addend described below;
      (2) multiplying the first sum by a constant k to produce a product;
      (3) creating a second sum by adding together:
         (A) the first input to the step series; and (B) the product, the product first being multiplied by −1 if k is greater than 0;
the second sum being a first output of the step series;
(4) delaying a second input to the step series, the delayed second input being the second addend to the first sum, the delayed second input first being multiplied by −1 if k is less than 0; and
(5) creating a third sum by adding together:

(A) the product; and
(B) the delayed second input, without sign adjustment; and (d) displaying a filtered navigation signal emerging from an output of one of the step series.

* * * * *